(12) United States Patent
Su et al.

(10) Patent No.: US 8,772,119 B2
(45) Date of Patent: Jul. 8, 2014

(54) FABRICATING METHOD OF TRANSISTOR

(75) Inventors: Kuo-Hui Su, Taipei (TW); Yi-Nan Chen, Taipei (TW); Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 228 days.

(21) Appl. No.: 13/236,656

(22) Filed: Sep. 20, 2011

(65) Prior Publication Data
US 2013/0071978 A1 Mar. 21, 2013

(51) Int. Cl.
*H01L 21/336* (2006.01)

(52) U.S. Cl.
USPC ............. 438/300; 257/E21.619; 257/E21.624

(58) Field of Classification Search
USPC ................... 257/326, 329, 330; 438/300, 592
See application file for complete search history.

(56) References Cited

U.S. PATENT DOCUMENTS

| 2007/0108514 A1 * | 5/2007 | Inoue et al. | 257/330 |
| 2008/0054352 A1 * | 3/2008 | Imoto et al. | 257/330 |
| 2008/0272420 A1 * | 11/2008 | Lee | 257/292 |

FOREIGN PATENT DOCUMENTS

| TW | 200818507 | 4/2008 |
| TW | 200933889 | 8/2009 |

OTHER PUBLICATIONS

"Office Action of Taiwan counterpart application" issued on Nov. 22, 2013, p. 1-p. 5.

* cited by examiner

*Primary Examiner* — Kimberly Rizkallah
*Assistant Examiner* — Errol Fernandes
(74) *Attorney, Agent, or Firm* — Jianq Chyun IP Office

(57) ABSTRACT

A fabricating method of a transistor is provided. A patterned sacrificed layer is formed on a substrate, wherein the patterned sacrificed layer includes a plurality of openings exposing the substrate. By using the patterned sacrificed layer as a mask, a doping process is performed on the substrate, thereby forming a doped source region and a doped drain region in the substrate exposed by the openings. A selective growth process is performed to form a source and a drain on the doped source region and the doped drain region, respectively. The patterned sacrificed layer is removed to expose the substrate between the source and the drain. A gate is formed on the substrate between the source and the drain.

14 Claims, 3 Drawing Sheets

FABRICATING METHOD OF TRANSISTOR

BACKGROUND OF THE INVENTION

1. Field of the Invention

The invention relates to a fabricating method of a semiconductor device and more particularly to a fabricating method of a transistor.

2. Description of Related Art

In order to accelerate operating speed of integrated circuit and to meet customers' demands on miniaturizing electronic devices, physical dimensions of transistors in a semiconductor device are continuously reduced. However, as the dimension of the transistor is reduced, its channel length will also decrease with ease leading to problems such as short channel effect, decrease of turn-on current, and increase of leakage current. Accordingly, the reliability of the device is reduced.

Generally, a doped source region and a doped drain region are formed in a substrate at two sides of a gate, and contacts are then formed to electrically connect the doped source region and the doped drain region, respectively. However, with the miniaturization of devices, a serious junction leakage is generated when the distance between the contacts and the doped regions is too short. In detail, as the dimension of the device is minimized, the distance between the doped source region and the doped drain region is reduced and electric field thereof is increased. Therefore, the junction leakage occurs in the doped source region and the doped drain region, and turn on and turn off of the transistor is not controlled by the gate.

In the conventional technique, formation of elevated source and drain is proposed to reduce the junction leakage, that is, a source and a drain having a specific height are respectively formed on the doped source region and the doped drain region, thereby increasing the distance between the contacts and the doped regions. However, since the elevated source and drain are generally formed by filling an epitaxial layer in the openings through a selective epitaxial process, incomplete gap-filling of the epitaxial layer is likely to occur when the dimension of the device is continuously reduced. Accordingly, a thickness of the formed source and drain is not sufficient to prevent the junction leakage of the doped source region and the doped drain region.

SUMMARY OF THE INVENTION

The invention is directed to a fabricating method of a transistor, so as to form an elevated source and drain having a desired thickness.

The invention is directed to a fabricating method of a transistor. A patterned sacrificed layer is formed on a substrate, wherein the patterned sacrificed layer includes a plurality of openings exposing the substrate. By using the patterned sacrificed layer as a mask, a doping process is performed on the substrate, thereby forming a doped source region and a doped drain region in the substrate exposed by the openings. A selective growth process is performed to form a source and a drain on the doped source region and the doped drain region, respectively. The patterned sacrificed layer is removed to expose the substrate between the source and the drain. A gate is formed on the substrate between the source and the drain.

In an embodiment of the invention, a height of the source and the drain is from 15 nm to 50 nm.

In an embodiment of the invention, the selective growth process includes a selective silicon growth process.

In an embodiment of the invention, a material of the patterned sacrificed layer includes silicon oxide.

In an embodiment of the invention, a thickness of the patterned sacrificed layer is smaller than or equal to 10 nm.

In an embodiment of the invention, a method of removing the patterned sacrificed layer includes a stripping process.

In an embodiment of the invention, the gate includes a gate dielectric layer and a gate conductive layer which are sequentially formed on the substrate.

In an embodiment of the invention, the gate conductive layer includes a polysilicon layer and a silicide layer.

In an embodiment of the invention, a method of forming the gate includes the following steps. A gate dielectric material layer is formed on the substrate to cover the source and the drain. A gate conductive material layer is formed on the gate dielectric material layer. By using tops of the source and the drain as a polishing stop layer, a planarization process is performed to the gate dielectric material layer and the gate conductive material layer.

In an embodiment of the invention, the planarization process includes a chemical mechanical polishing process.

In an embodiment of the invention, the gate conductive material layer includes a polysilicon material layer and a silicide material layer.

In an embodiment of the invention, further includes forming an insulating layer on the substrate to cover the gate, the source, and the drain.

In an embodiment of the invention, further includes forming a plurality of contacts in the insulating layer to electrically connect the source and the drain, respectively.

In an embodiment of the invention, a material of the insulating layer includes tetraethyl orthosilicate (TEOS) or borophosphosilicate glass (BPSG).

In view of the above, in the fabricating method of the transistor, the doped source region and the doped drain region are defined in the substrate by using the patterned sacrificed layer, and then the elevated source and drain are formed on the doped source region and the doped drain region by the selective growth process. Therefore, the elevated source and drain having a desired thickness are formed by simplified steps, and thus the junction leakage of the doped source region and the doped drain region is prevented.

In order to make the aforementioned and other features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
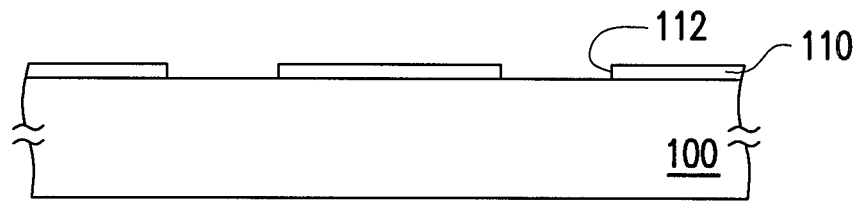
FIGS. 1A to 1G are cross-sectional schematic views illustrating a fabricating method of a transistor according to an embodiment of the invention.

FIGS. 1A to 1G are cross-sectional schematic views illustrating a fabricating method of a transistor according to an embodiment of the invention. Referring to FIG. 1A, a patterned sacrificed layer 110 is formed on a substrate 100, wherein the patterned sacrificed layer 110 includes a plurality of openings 112 exposing the substrate 100. In the present embodiment, the substrate 100 is, for example, a silicon substrate or other substrates. A material of the patterned sacrificed layer 110 is, for example, silicon oxide. In the present embodiment, a method of forming the patterned sacrificed layer 110, for instance, is to form a sacrificed layer (not shown) on the substrate 100 and then pattern the sacrificed layer. The sacrificed layer is formed, for example, by performing a chemical vapor deposition process or thermal oxidation process. A thickness of the patterned sacrificed layer 110 is, for example, smaller than or equal to 10 nm.

Figure 1B:
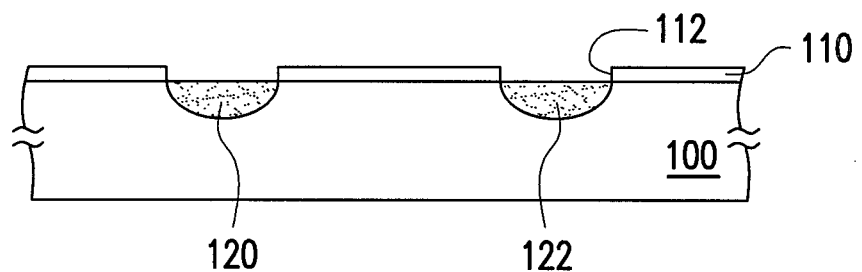

Referring to FIG. 1B, then, by using the patterned sacrificed layer 110 as a mask, a doping process is performed on the substrate 100, thereby forming a doped source region 120 and a doped drain region 122 in the substrate 100 exposed by the openings 112. In the present embodiment, the doping process is, for example, an ion implantation process. The doped source region 120 and the doped drain region 122 are P-type or N-type doped regions.

Figure 1C:
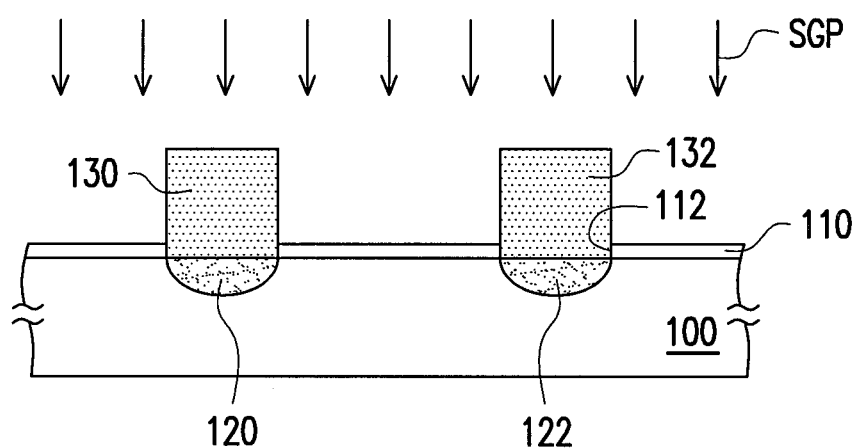

Referring to FIG. 1C, thereafter, a selective growth process SGP is performed to form a source 130 and a drain 132 on the doped source region 120 and the doped drain region 122, respectively. In the present embodiment, since the patterned sacrificed layer 110 covers the substrate 100 between the doped source region 120 and the doped drain region 122, by the selective growth process SGP, an epitaxial material layer is grown from the doped source region 120 and the doped drain region 122 which are exposed by the openings 112. In other words, the epitaxial material layer is not grown on the patterned sacrificed layer 110. Therefore, the source 130 and the drain 132 are formed on and electrically connected to the source region 120 and the doped drain region 122, respectively. In the present embodiment, the selective growth process SGP is, for example, a selective silicon growth process. A height of the source 130 and the drain 132 is from 15 nm to 50 nm, for instance.

Figure 1D:
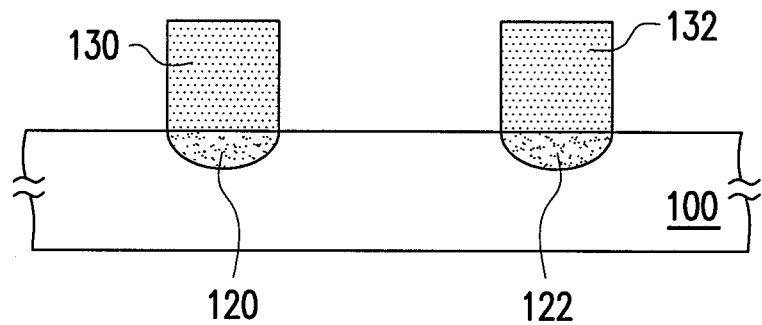

Referring to FIG. 1D, the patterned sacrificed layer 110 is then removed to expose the substrate 100 between the source 130 and the drain 132. In the present embodiment, a method of removing the patterned sacrificed layer 110 includes a stripping process or other suitable processes.

Figure 1E:
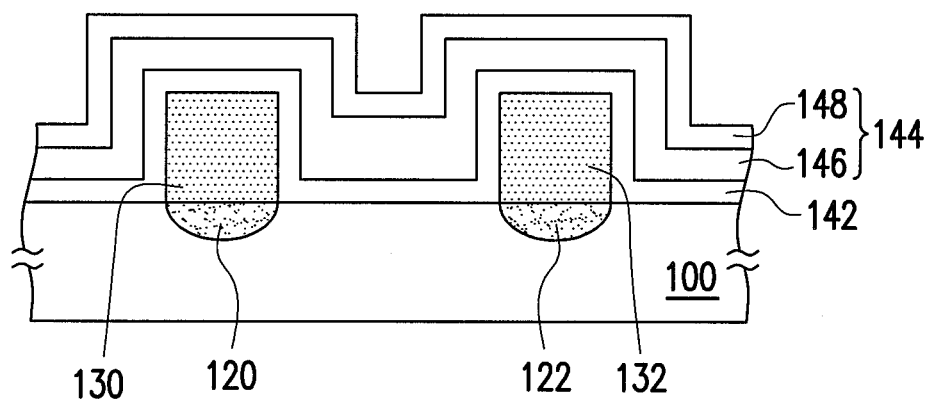
Figure 1F:
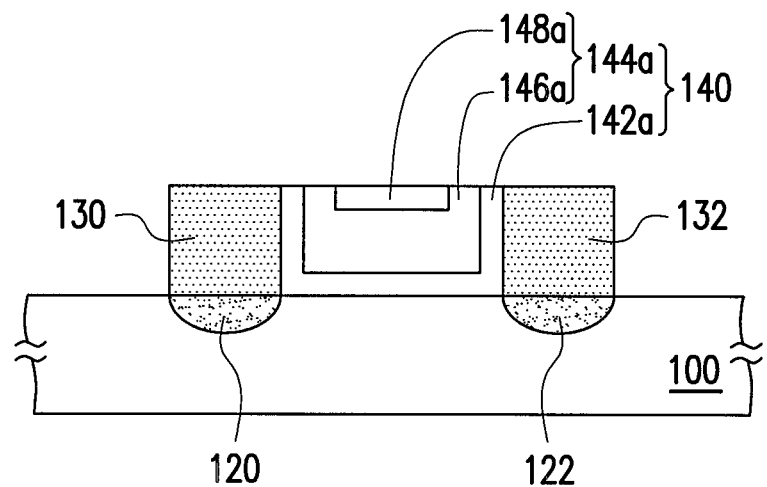

Referring to FIGS. 1E and 1F, a gate 140 is formed on the substrate 100 between the source 130 and the drain 132. In the present embodiment, a method of forming the gate 140 is as follows. A gate dielectric material layer 142 is formed on the substrate 100 to cover the source 130 and the drain 132. In the present embodiment, a material of the gate dielectric material layer 142 is, for example, silicon oxide, and a method of forming the gate dielectric material layer 142 is, for example, chemical vapor deposition. Then, a gate conductive material layer 144 is formed on the gate dielectric material layer 142. In the present embodiment, the gate conductive material layer 144 includes a polysilicon material layer 146 and a silicide material layer 148 sequentially formed on the gate dielectric material layer 142. The polysilicon material layer 146 may be formed by performing a chemical vapor deposition process. A material of the silicide material layer 148 may be tungsten silicide, titanium silicide, cobalt silicide, molybdenum silicide, nickel silicide, palladium silicide or platinum silicide, for example. The silicide material layer 148 may be formed, for example, by performing a chemical vapor deposition process or performing an annealing process to react the polysilicon material layer 146 with a metal layer.

Thereafter, as shown in FIG. 1F, by using tops of the source 130 and the drain 132 as a polishing stop layer, a planarization process is performed to the gate dielectric material layer 142 and the gate conductive material layer 144, so as to form a gate dielectric layer 142a and a gate conductive layer 144a including a polysilicon layer 146a and a silicide layer 148a. In the present embodiment, the planarization process is, for example, a chemical mechanical polishing (CMP) process. In the present embodiment, the gate 140 includes, for example, the gate dielectric layer 142a and the gate conductive layer 144a sequentially formed on the substrate 100, wherein the gate conductive layer 144a includes the polysilicon layer 146a and the silicide layer 148a sequentially formed on the gate dielectric layer 142a. A width of the gate 140, which is also a distance between the source 130 and the drain 132, is smaller than 60 nm, for example. It is mentioned that although the gate 140 in the present embodiment has a structure described above, but the invention is not limited thereto. In other words, the gate 140 can also have other structures and be formed by other methods which are well known to people having ordinary skill in the art.

Figure 1G:
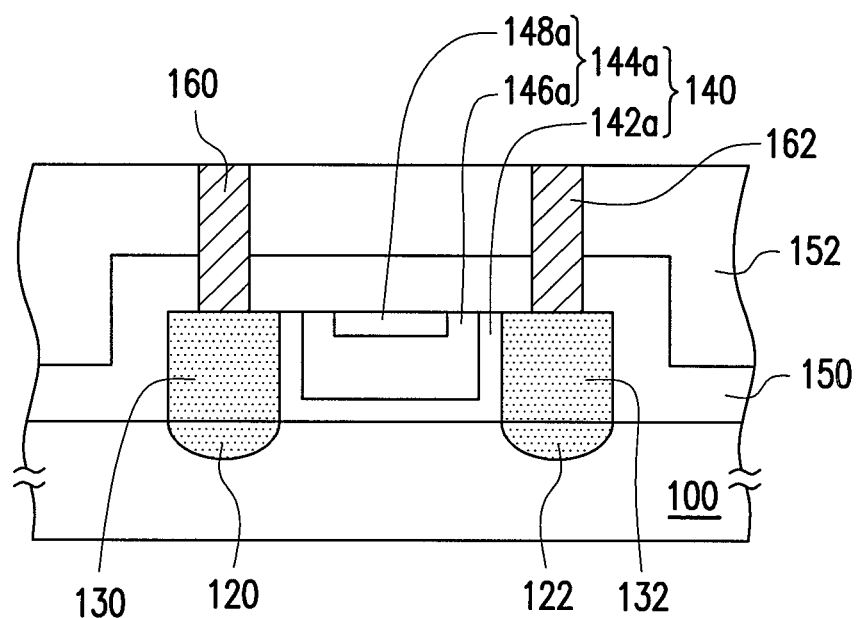

Referring to FIG. 1G, afterwards, insulating layers 150, 152 are formed on the substrate 100 to cover the gate 140, the source 130, and the drain 132. In the present embodiment, a material of the insulating layer 150 is, for example, tetraethyl orthosilicate (TEOS), a material of the insulating layer 152 is, for example, borophosphosilicate glass (BPSG), and a method of forming the insulating layers 150, 152 is, for example, chemical vapor deposition. Then, a plurality of contacts 160, 162 are formed in the insulating layers 150, 152 to electrically connect the source 130 and the drain 132, respectively The contacts 160, 162 are made of tungsten or other appropriate conductive materials, for example. Since subsequent processes performing after the step of forming the contacts 160, 162 are semiconductor process well known to people having ordinary skill in the art, a detailed description is omitted here.

In the present embodiment, the patterned sacrificed layer 110 is used as a mask in the doping process, so that the doped source region 120 and the doped drain region 122 are formed in the substrate 100 exposed by the openings 112. Moreover, in the selective growth process, only the doped source region 120 and the doped drain region 122 are exposed by the openings 112 of the patterned sacrificed layer 110, and therefore the epitaxial layer is merely grown on the doped source region 120 and the doped drain region 122 to form the source 130 and the drain 132. In other words, the patterned sacrificed layer 110 is used to define the doped source region 120, the doped drain region 122 and the elevated source 130 and drain 132 grown on the doped source region 120 and the doped drain region 122. Compared to elevated source and drain which are conventionally formed by filling materials in the openings, in the present embodiment, the source 130 and the drain 132 are directly formed on the doped source region 120 and the doped drain region 122. Therefore, in the fabricating method of the transistor of the present embodiment, incomplete gap-filling of the small-sized opening is prevented, and the source 130 and the drain 132 have a desired thickness even the dimension of the device is continuously reduced. Accordingly, the distance between the contacts 160, 162 and the doped source region 120 and the doped drain region 122 is increased, and the junction leakage between the contacts 160, 162 and the doped source region 120 and the doped drain region 122 is prevented. In other words, the fabricating method of the transistor of the present embodiment has simplified steps, and is suitable for fabricating elevated source and drain having a desired thickness as the dimension of the device is continuously reduced. Moreover, the junction leakage of the doped source region and the doped drain region is prevented, and thus the device characteristics of the transistor are improved.

In summary, in the fabricating method of the transistor of the invention, the doped source region and the doped drain region are defined in the substrate by using the patterned sacrificed layer as a mask, and then the elevated source and drain are formed on the doped source region and the doped drain region by the selective growth process. In other words, the fabricating method of the transistor of the invention has simplified steps, and is suitable for fabricating elevated source and drain having a desired thickness as the dimension of the device is continuously reduced. Moreover, the junction leakage of the doped source region and the doped drain region is prevented, and thus the device characteristics of the transistor are improved.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A fabricating method of a transistor, comprising:
   forming a patterned sacrificed layer on a substrate, wherein the patterned sacrificed layer includes a plurality of openings exposing the substrate;
   by using the patterned sacrificed layer as a mask, performing a doping process on the substrate, thereby forming a doped source region and a doped drain region in the substrate exposed by the openings;
   performing a selective growth process to form a source and a drain on the doped source region and the doped drain region, respectively;
   removing the patterned sacrificed layer to expose the substrate between the source and the drain; and
   forming a gate on the substrate between the source and the drain, wherein a height of the gate is substantially the same as a height of the source and the drain.

2. The fabricating method as claimed in claim 1, wherein a height of the source and the drain is from 15 nm to 50 nm.

3. The fabricating method as claimed in claim 1, wherein the selective growth process comprises a selective silicon growth process.

4. The fabricating method as claimed in claim 1, wherein a material of the patterned sacrificed layer comprises silicon oxide.

5. The fabricating method as claimed in claim 1, wherein a thickness of the patterned sacrificed layer is smaller than or equal to 10 nm.

6. The fabricating method as claimed in claim 1, wherein a method of removing the patterned sacrificed layer comprises a stripping process.

7. The fabricating method as claimed in claim 1, wherein the gate comprises a gate dielectric layer and a gate conductive layer which are sequentially formed on the substrate.

8. The fabricating method as claimed in claim 7, wherein the gate conductive layer comprises a polysilicon layer and a silicide layer.

9. The fabricating method as claimed in claim 1, wherein a method of forming the gate comprises:
   forming a gate dielectric material layer on the substrate to cover the source and the drain;
   forming a gate conductive material layer on the gate dielectric material layer; and
   by using tops of the source and the drain as a polishing stop layer, performing a planarization process to the gate dielectric material layer and the gate conductive material layer.

10. The fabricating method as claimed in claim 9, wherein the planarization process comprises a chemical mechanical polishing process.

11. The fabricating method as claimed in claim 9, wherein the gate conductive material layer comprises a polysilicon material layer and a silicide material layer.

12. The fabricating method as claimed in claim 1, further comprising forming an insulating layer on the substrate to cover the gate, the source, and the drain.

13. The fabricating method as claimed in claim 12, further comprising forming a plurality of contacts in the insulating layer to electrically connect the source and the drain, respectively.

14. The fabricating method as claimed in claim 12, wherein a material of the insulating layer comprises tetraethyl orthosilicate (TEOS) or borophosphosilicate glass (BPSG).

* * * * *